(12) United States Patent
Hu et al.

(10) Patent No.: US 11,169,227 B2
(45) Date of Patent: Nov. 9, 2021

(54) DUAL FREE LAYER TMR MAGNETIC FIELD SENSOR

(71) Applicant: Western Digital Technologies, Inc., San Jose, CA (US)

(72) Inventors: Chih-Ching Hu, Pleasanton, CA (US); Yung-Hung Wang, San Jose, CA (US); Yuankai Zheng, Fremont, CA (US); Chen-jung Chien, Mountain View, CA (US); Ming Mao, Dublin, CA (US); Daniele Mauri, San Jose, CA (US); Ming Jiang, San Jose, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 87 days.

(21) Appl. No.: 16/730,777

(22) Filed: Dec. 30, 2019

(65) Prior Publication Data

US 2021/0063508 A1 Mar. 4, 2021

Related U.S. Application Data

(60) Provisional application No. 62/892,642, filed on Aug. 28, 2019.

(51) Int. Cl.
*H01L 43/12* (2006.01)
*G01R 33/09* (2006.01)
(Continued)

(52) U.S. Cl.
CPC .......... *G01R 33/098* (2013.01); *G01R 17/105* (2013.01); *G01R 33/093* (2013.01);
(Continued)

(58) Field of Classification Search
CPC .. G01R 33/098; G01R 17/105; G01R 33/093; H01L 43/02; H01L 43/08; H01L 43/10; H01L 43/12
(Continued)

(56) References Cited

U.S. PATENT DOCUMENTS 9,449,621 B1 9/2016 Mauri et al.
9,591,221 B2 3/2017 Miller et al.
(Continued)

FOREIGN PATENT DOCUMENTS

CN 108431620 A 8/2018

OTHER PUBLICATIONS

International Search Report issued in corresponding International Patent Application No. PCT/US2020/023983, dated Jul. 13, 2020 (11 pages).

*Primary Examiner* — Jami Valentine Miller
(74) *Attorney, Agent, or Firm* — Patterson & Sheridan, LLP; Steven H. Versteeg (57) ABSTRACT

The present disclosure generally relates to a Wheatstone bridge that includes a plurality of resistors comprising dual free layer (DFL) TMR structures. The DFL TMR structures include one or more hard bias structures on the side of DLF. Additionally, one or more soft bias structures may also be present on a side of the DFL. Two resistors will have identical hard bias material while two other resistors will have hard bias material that is identical to each other, yet different when compared to the first two resistors. The hard bias materials will provide opposite magnetizations that will provide opposite bias fields that result in two different magnetoresistance responses for the DFL TMR.

20 Claims, 12 Drawing Sheets

(51) Int. Cl.
*G01R 17/10* (2006.01)
*H01L 43/08* (2006.01)
*H01L 43/10* (2006.01)
*H01L 43/02* (2006.01)

(52) U.S. Cl.
CPC .............. *H01L 43/02* (2013.01); *H01L 43/08* (2013.01); *H01L 43/10* (2013.01); *H01L 43/12* (2013.01)

(58) Field of Classification Search
USPC ........................................................ 257/421
See application file for complete search history.

(56) References Cited

U.S. PATENT DOCUMENTS

| | | |
|---|---|---|
| RE46,428 E | 6/2017 | Mather et al. |
| 9,684,184 B2 | 6/2017 | Miller et al. |
| 2008/0080101 A1* | 4/2008 | Mauri .................... B82Y 25/00 360/324.2 |
| 2008/0272771 A1 | 11/2008 | Guo et al. |
| 2009/0168271 A1* | 7/2009 | Mauri ................... G11B 5/3909 360/324.12 |
| 2016/0291097 A1 | 10/2016 | Kuo et al. |
| 2018/0335484 A1* | 11/2018 | Campiglio ........... G01R 33/098 |
| 2019/0018083 A1* | 1/2019 | Fujiwara ................ G01R 33/10 |
| 2019/0020822 A1 | 1/2019 | Sharma et al. |
| 2021/0135091 A1* | 5/2021 | Park ...................... H01L 27/222 |

* cited by examiner

DUAL FREE LAYER TMR MAGNETIC FIELD SENSOR

CROSS-REFERENCE TO RELATED APPLICATIONS

This application claims benefit of U.S. Provisional Patent Application Ser. No. 62/892,642, filed Aug. 28, 2019, which is herein incorporated by reference.

BACKGROUND OF THE DISCLOSURE

Field of the Disclosure

Embodiments of the present disclosure generally relate to a Wheatstone bridge and a method of manufacture thereof.

Description of the Related Art

A Wheatstone bridge is an electrical circuit used to measure an unknown electrical resistance by balancing two legs of a bridge circuit, one leg of which includes an unknown component. The Wheatstone circuit provides extremely accurate measurements in comparison to a simple voltage divider.

The Wheatstone bridge includes multiple resistors that, especially recently, include magnetic material such as magnetic sensor. Magnetic sensors can include Hall effect magnetic sensors, anisotropy magnetoresistive sensors (AMR), giant magnetoresistive (GMR) sensors, and tunnel magnetoresistive (TMR) sensors. The TMR sensor has a very high sensitivity compared to other magnetic sensors.

The typical magnetic field sensor uses a TMR device as discussed above. To have the Wheatstone bridge operate properly, the resistors in the Wheatstone bridge need to be set up to have the magnetoresistance change differently. If the magnetoresistance changes are identical for the resistors, then the Wheatstone bridge will not function properly. In other words, the Wheatstone bridge will be useless.

Therefore, there is a need in the art for a Wheatstone bridge that has magnetoresistance that changes differently at different resistors.

SUMMARY OF THE DISCLOSURE

The present disclosure generally relates to a Wheatstone bridge that includes a plurality of resistors comprising dual free layer (DFL) TMR structures. The DFL TMR structures include one or more hard bias structures on the side of DLF. Additionally, one or more soft bias structures may also be present on a side of the DFL. Two resistors will have identical hard bias material while two other resistors will have hard bias material that is identical to each other, yet different when compared to the first two resistors. The hard bias materials will provide opposite magnetizations that will provide opposite bias fields that result in two different magnetoresistance responses for the DFL TMR.

In one embodiment, a TMR sensor device comprises: a first resistor including a dual free layer (DFL) TMR structure having at least one first hard bias structure of a first hard bias material; and a second resistor including a DFL TMR structure having at least one second hard bias structure of a second hard bias material that is different from the first hard bias material.

In another embodiment, a TMR sensor device comprises: a plurality of resistors that each comprises a DFL TMR structure, one or more hard bias structures adjacent the DFL TMR structure, and one or more soft bias structures adjacent the DFL TMR structure and the one or more hard bias structures, wherein the one or more hard bias structures are different in at least two resistors of the plurality of resistors.

In another embodiment, a method of making a TMR sensor device comprises: forming a bottom lead over a substrate; forming a DFL TMR structure over the bottom lead for a first resistor and a second resistor; forming at least one hard bias structure adjacent the DFL TMR structure for the first resistor; forming at least one hard bias structure adjacent the DFL TMR structure for the second resistor; applying a first magnetic field initialization to the first resistor and the second resistor; and applying a second magnetic field initialization to the first resistor and the second resistor, wherein the second magnetic field is different from the first magnetic field.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to a Wheatstone bridge that includes a plurality of resistors comprising dual free layer (DFL) TMR structures. The DFL TMR structures include one or more hard bias structures on the side of DLF. Additionally, one or more soft bias structures may also be present on a side of the DFL. Two resistors will have identical hard bias material while two other resistors will have hard bias material that is identical to each other, yet different when compared to the first two resistors. The hard bias materials will provide opposite magnetizations that will provide opposite bias fields that result in two different magnetoresistance responses for the DFL TMR.

Figure 1:
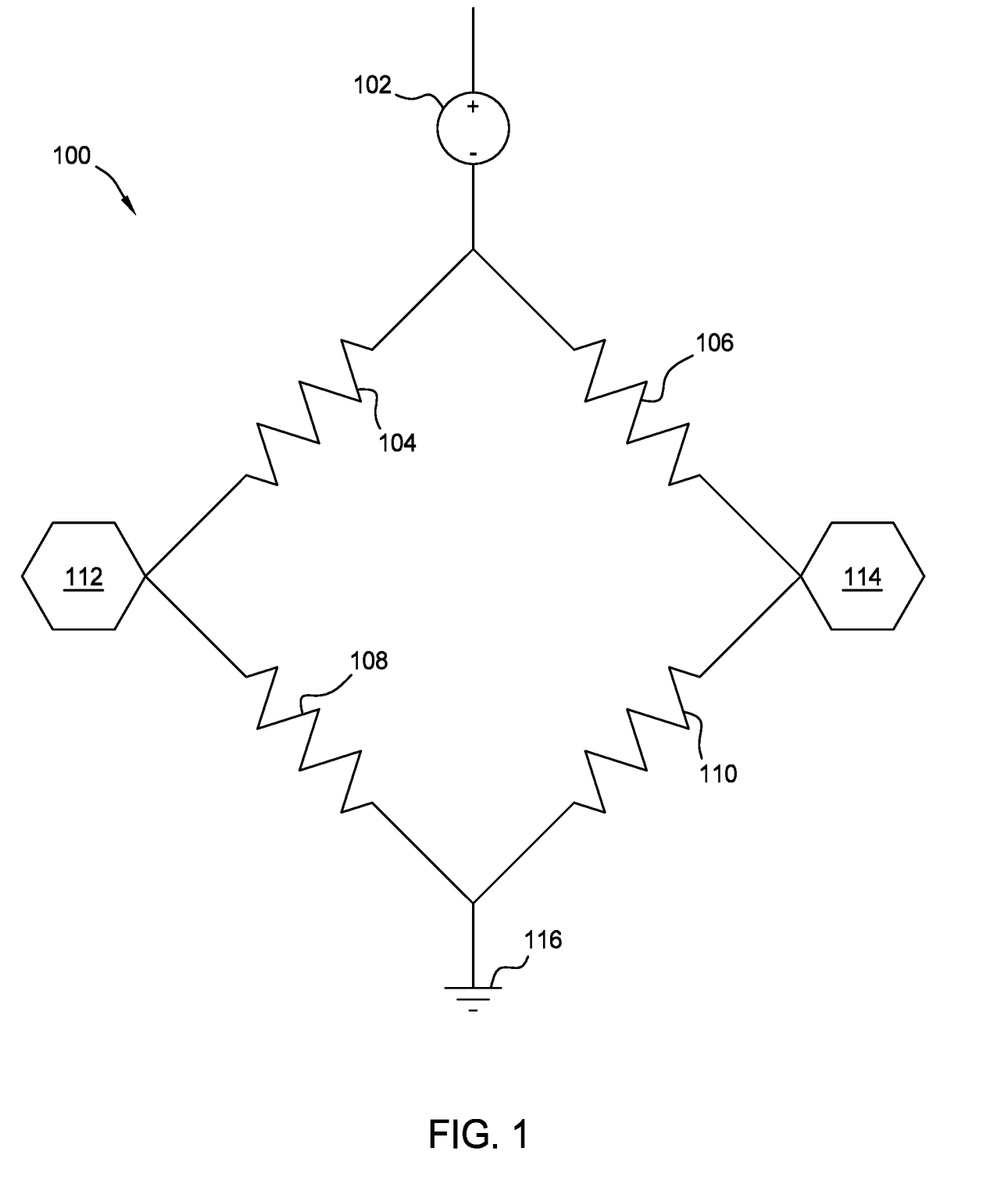
FIG. 1 is a schematic illustration of a Wheatstone bridge design.

FIG. 1 is a schematic illustration of a Wheatstone bridge 100 design. The array 100 includes a bias source 102, a first resistor 104, a second resistor 106, a third resistor 108, a fourth resistor 110, a first output pad 112, a second output pad 114, and a ground connection 116. Bias voltage is applied across the bridge from the bias source 102 to the ground connection 116. The bridge output is the potential difference across the first output pad 112 and the second output pad 114. Any change in resistance due to temperature variation from the resistors 104, 106, 108, 110 is nullified due to the nature of differential output.

As discussed herein, the resistors 104, 106, 108, 110 each is made of a TMR film. In one embodiment, the TMR resistors are each distinct and different such that the resistors 104, 106, 108, 110 have different resistance. In another embodiment, the TMR resistors are identical, but the resistors 104, 106, 108, 110 are different. In still another embodiment, resistors 104, 110 are identical to each other (as are the TMR films that the resistors 104, 110 are made of), and resistors 106, 108 are identical to each other (as are the TMR films that the resistors 106, 108 are made of) yet different from resistors 104, 110.

Typical magnetic field sensors use TMR resistors in a Wheatstone bridge circuit. The TMR resistors have to have different responses to the magnetic field in order to generate the differential output voltage. As discussed herein, a new method to make a magnetic field sensor is to fabricate two different TMR resistors using the same DFL TMR film but with two different hard bias materials on the sides. The hard bias materials will provide opposite magnetizations that will provide opposite bias fields that result in two different magnetoresistance responses for the DFL TMR. In this way, a perfect Wheatstone bridge design for magnetic field sensor can be fabricated.

Figure 2A:
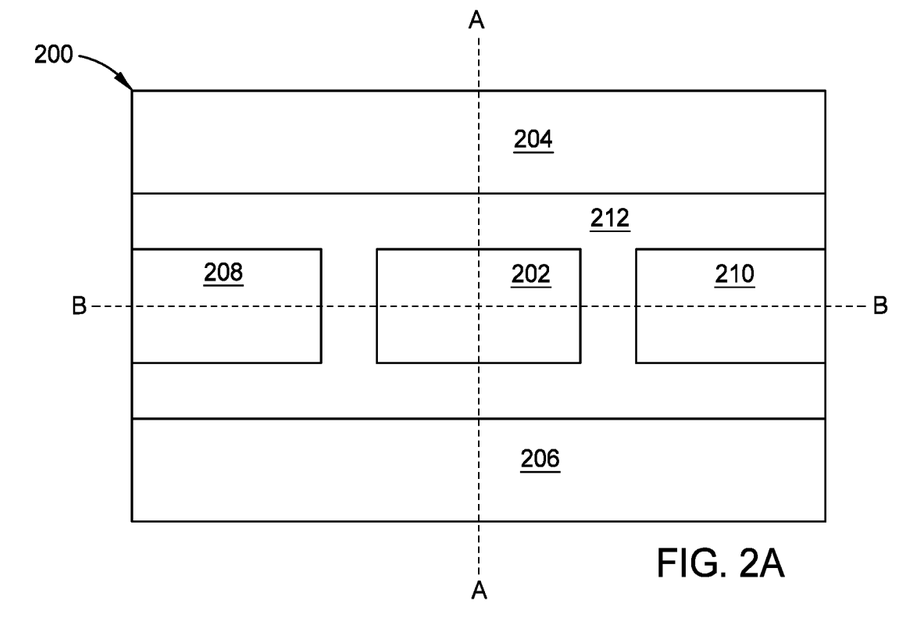
FIGS. 2A-2C are schematic illustrations of a DFL TMR resistor unit that has hard bias structures on both sides of the DFL.
Figure 2B:
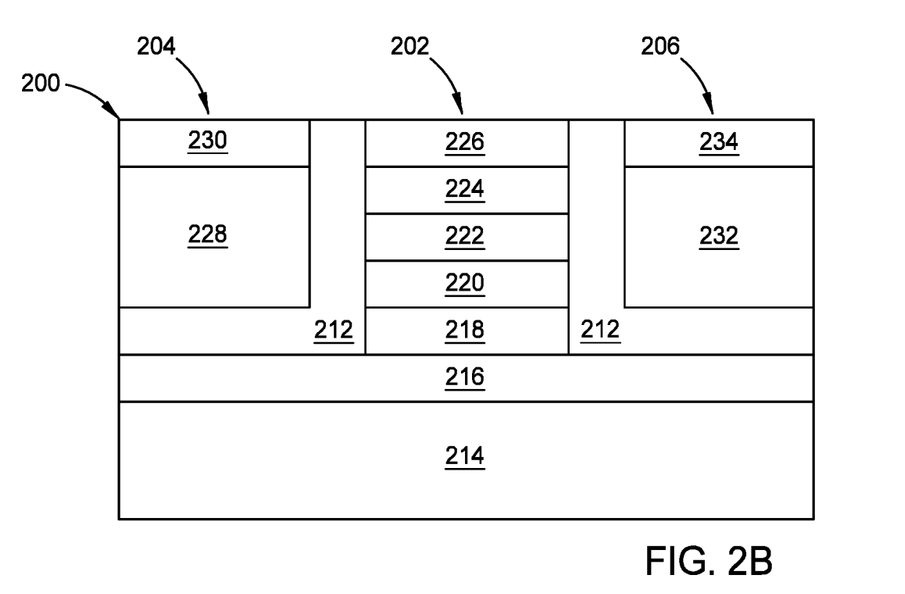
Figure 2C:
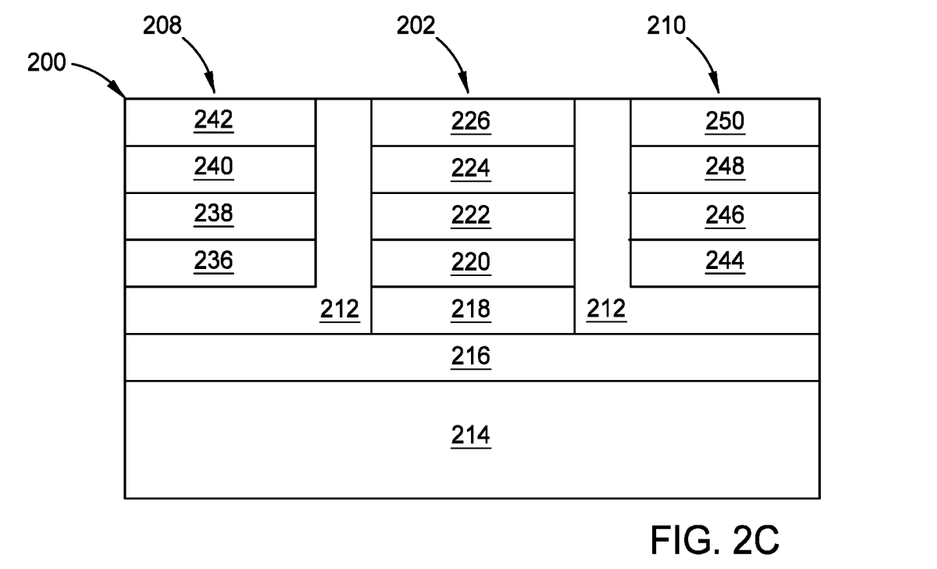

FIGS. 2A-2C are schematic illustrations of a DFL TMR resistor unit 200 that has hard bias structures on both sides of the DFL. FIG. 2A is a top view of the sensor unit 200 while FIG. 2B is a cross section taken along line A-A and FIG. 2C is a cross section taken along line B-B. The sensor unit 200 includes a DLF TMR 202, a first hard bias structure 204, a second hard bias structure 206, a first soft bias structure 208, a second soft bias structure 210, and insulating material 212.

As shown in FIG. 2B, the DFL TMR 202 is disposed on a substrate 214. Suitable materials for the substrate 214 include semiconductor materials such as Si. Furthermore, while the substrate 214 is shown as a single layer, it is to be understood that the substrate 214 may comprise multiple layers such as would be present in a CMOS structure.

A bottom lead 216 is formed on the substrate 214. Suitable material for the bottom lead 216 include electrically conductive material such as coper, tungsten, tantalum, aluminum, and alloys thereof. The thickness of the bottom lead 216 may be between about 20 nm and about 500 nm.

The DFL TMR 202 is formed on the bottom lead 216. The DFL TMR 202 includes a seed layer 218 disposed on the bottom lead 216. The seed layer 218 comprises a conductive material such as ruthenium and has a thickness of between about 10 Angstroms to about 100 Angstroms and is deposited by well-known deposition methods such as electroplating, electroless plating, or sputtering. Additionally, it is to be understood that while ruthenium has been exemplified as the seed layer 218 material, other materials are contemplated and the embodiments discussed herein are not limited to ruthenium for the seed layer 218.

A first free layer 220 is formed on the seed layer 218. Suitable materials for the first free layer 220 include a CoFe/CoFeB/Ta/NiFe multilayer stack. The CoFe layer may have a thickness of between about 3 Angstroms to about 10 Angstroms. The CoFeB layer may have a thickness of between about 10 Angstroms to about 20 Angstroms. The Ta layer may have a thickness of between about 0.5 Angstroms to about 2 Angstroms. The NiFe layer may have a thickness of between about 3 Angstroms to about 300 Angstroms, such as between about 3 Angstroms and about 10 Angstroms or between about 10 Angstroms and about 300 Angstroms. The first free layer 220 may be formed by well-known deposition methods such as sputtering. Additionally, it is to be understood that while CoFe/CoFeB/Ta/NiFe has been exemplified as the first free layer 220 material, other materials are contemplated and the embodiments discussed herein are not limited to CoFe/CoFeB/Ta/NiFe for the first free layer 220.

A barrier layer 222 is formed on the first free layer 220. Suitable material for the barrier layer 222 include MgO at a thickness of between about 10 Angstroms to about 20 Angstroms. It is to be understood that while MgO is exemplified as the barrier layer 222, other insulating materials as contemplated.

A second free layer 224 is formed on the barrier layer 222. Suitable materials for the second free layer 224 include a CoFe/CoFeB/Ta/NiFe multilayer stack. The CoFe layer may have a thickness of between about 3 Angstroms to about 10 Angstroms. The CoFeB layer may have a thickness of between about 10 Angstroms to about 20 Angstroms. The Ta layer may have a thickness of between about 0.5 Angstroms to about 2 Angstroms. The NiFe layer may have a thickness of between about 3 Angstroms to about 300 Angstroms, such as between about 3 Angstroms and about 10 Angstroms or between about 10 Angstroms and about 300 Angstroms. The second free layer 224 may be formed by well-known deposition methods such as sputtering. Additionally, it is to be understood that while CoFe/CoFeB/Ta/NiFe has been exemplified as the second free layer 224 material, other materials are contemplated and the embodiments discussed herein are not limited to CoFe/CoFeB/Ta/NiFe for the second free layer 224.

A capping layer 226 is formed on the second free layer 224. Suitable materials for the capping layer 226 include tantalum, ruthenium, titanium, and other non-magnetic, electrically conductive materials. The capping layer 226 may be formed by well-known deposition methods such as sputtering. The capping layer 226 may have a thickness of between about 10 Angstroms to about 100 Angstroms.

The first hard bias structure 204 includes a first hard bias material 228. Suitable materials for the hard bias material include CoPt, CoCrPt, FePt, or other ferromagnetic alloys, or TbFeCo, DyFeCo, GdFeCo, NdFeB, SmCo, or other ferrimagnetic alloys containing rare-earth elements. The hard bias material 228 may be formed by well-known deposition processes such as sputtering. The hard bias material 228 may have a thickness of between about 40 Angstroms to about 700 Angstroms.

A capping layer 230 is disposed on the hard bias material 228. Suitable materials for the capping layer 230 include tantalum, ruthenium, titanium, and other non-magnetic, electrically conductive materials. The capping layer 230 may be formed by well-known deposition methods such as sputtering. The capping layer 230 may have a thickness of between about 10 Angstroms to about 100 Angstroms.

The second hard bias structure 206 includes a first hard bias material 232. Suitable materials for the hard bias material include CoPt, CoCrPt, FePt, or other ferromagnetic alloys, or TbFeCo, DyFeCo, GdFeCo, NdFeB, SmCo, or other ferrimagnetic alloys containing rare-earth elements. The hard bias material 232 may be formed by well-known deposition processes such as sputtering. The hard bias material 232 may have a thickness of between about 40 Angstroms to about 700 Angstroms.

A capping layer 234 is disposed on the hard bias material 232. Suitable materials for the capping layer 234 include tantalum, ruthenium, titanium, and other non-magnetic, electrically conductive materials. The capping layer 234 may be formed by well-known deposition methods such as sputtering. The capping layer 234 may have a thickness of between about 10 Angstroms to about 100 Angstroms.

The first soft bias structure 208 includes a multilayer structure comprising a first soft bias layer 236, a spacer layer 238, a second soft bias layer 240, and a capping layer 242. Suitable materials for the first soft bias layer 236 include NiFe, CoFe, CoNi, CoFeNi, CoFeB, and Co. The first soft bias layer 236 may be formed by well-known deposition methods such as sputtering. The first soft bias layer 236 may have a thickness of between about 15 Angstroms to about 340 Angstroms.

The spacer layer 238 is formed on the first soft bias layer 236. Suitable material for the spacer layer 238 include ruthenium at a thickness of between about 4 Angstroms to about 10 Angstroms.

The second soft bias layer 240 is formed on the spacer layer 238. Suitable materials for the second soft bias layer 240 include NiFe, CoFe, CoNi, CoFeNi, CoFeB, and Co. The second soft bias layer 240 may be formed by well-known deposition methods such as sputtering. The second soft bias layer 240 may have a thickness of between about 15 Angstroms to about 340 Angstroms.

The capping layer 242 is disposed on the second soft bias material 240. Suitable materials for the capping layer 242 include tantalum, ruthenium, titanium, and other non-magnetic, electrically conductive materials. The capping layer 242 may be formed by well-known deposition methods such as sputtering. The capping layer 242 may have a thickness of between about 10 Angstroms to about 100 Angstroms.

The second soft bias structure 210 includes a multilayer structure comprising a first soft bias layer 244, a spacer layer 246, a second soft bias layer 248, and a capping layer 250. Suitable materials for the first soft bias layer 244 include NiFe, CoFe, CoNi, CoFeNi, CoFeB, and Co. The first soft bias layer 244 may be formed by well-known deposition methods such as sputtering. The first soft bias layer 244 may have a thickness of between about 15 Angstroms to about 340 Angstroms.

The spacer layer 246 is formed on the first soft bias layer 244. Suitable material for the spacer layer 246 include ruthenium at a thickness of between about 4 Angstroms to about 10 Angstroms.

The second soft bias layer 248 is formed on the spacer layer 246. Suitable materials for the second soft bias layer 248 include NiFe, CoFe, CoNi, CoFeNi, CoFeB, and Co. The second soft bias layer 248 may be formed by well-known deposition methods such as sputtering. The second soft bias layer 248 may have a thickness of between about 15 Angstroms to about 340 Angstroms.

The capping layer 250 is disposed on the second soft bias material 248. Suitable materials for the capping layer 250 include tantalum, ruthenium, titanium, and other non-magnetic, electrically conductive materials. The capping layer 250 may be formed by well-known deposition methods such as sputtering. The capping layer 250 may have a thickness of between about 10 Angstroms to about 100 Angstroms.

The insulating layer 212 is formed on the bottom lead and around the DFL TMR 202 to avoid electric shorting between DFL TMR 202 and soft bias 208, 210, or between DFL TMR 202 and hard bias 204, 206. Suitable materials for the insulating layer 212 include dielectric materials such as aluminum oxide, silicon oxide, and silicon nitride. The insulating layer 212 may be formed by well-known deposition methods such as atomic layer deposition (ALD) or sputtering. The insulating layer 212 may have a thickness of between about 10 Angstroms to about 700 Angstroms.

In one embodiment, within a given resistor unit 200, the hard bias material 228, 232 will be identical. Additionally, the first soft bias layers 236, 244 will be identical. Furthermore, the second soft bias layers 240, 248 will be identical. Also, the spacer layers 238, 246 will be identical. The capping layers 242, 250 will also be identical, and the capping layers 230, 234 will be identical. Furthermore, the capping layers 230, 234, 242, 250 may be identical in one embodiment. In another embodiment, one or more of the capping layers 230, 234, 242, 250 are optional.

Figure 3A:
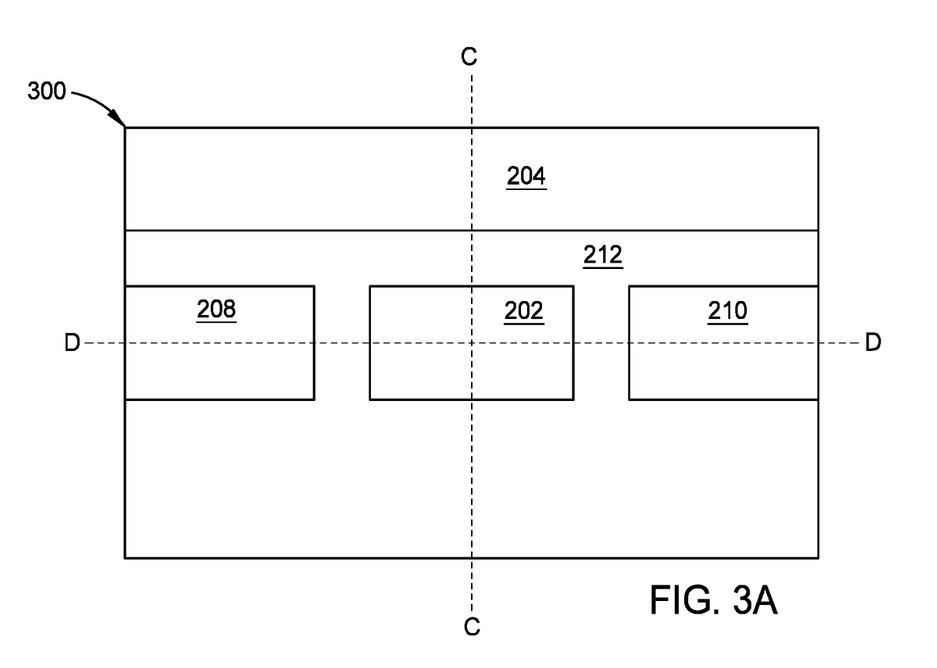
FIGS. 3A-3C are schematic illustrations of a DFL TMR resistor unit that has a hard bias structure on only one side of the DFL.
Figure 3B:
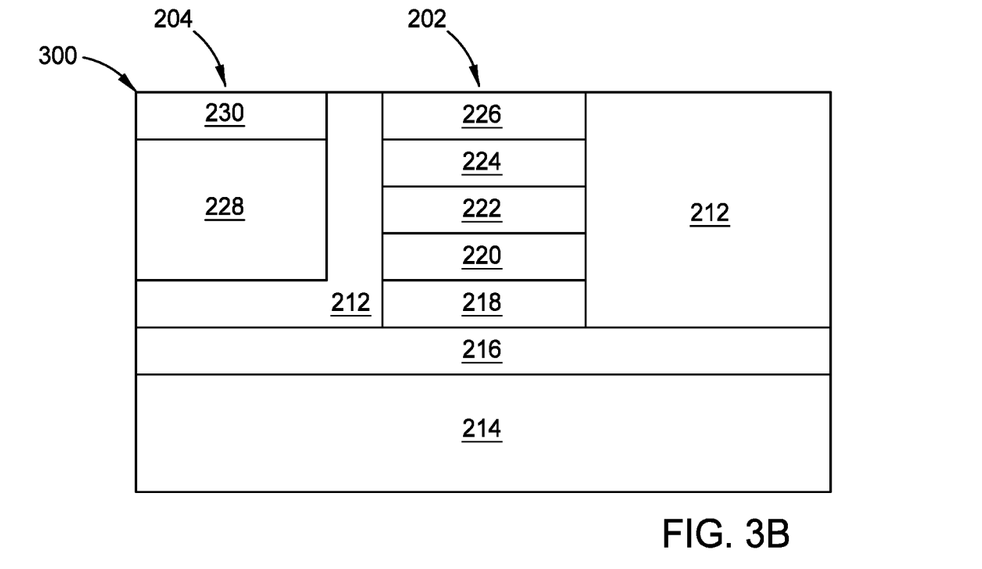
Figure 3C:
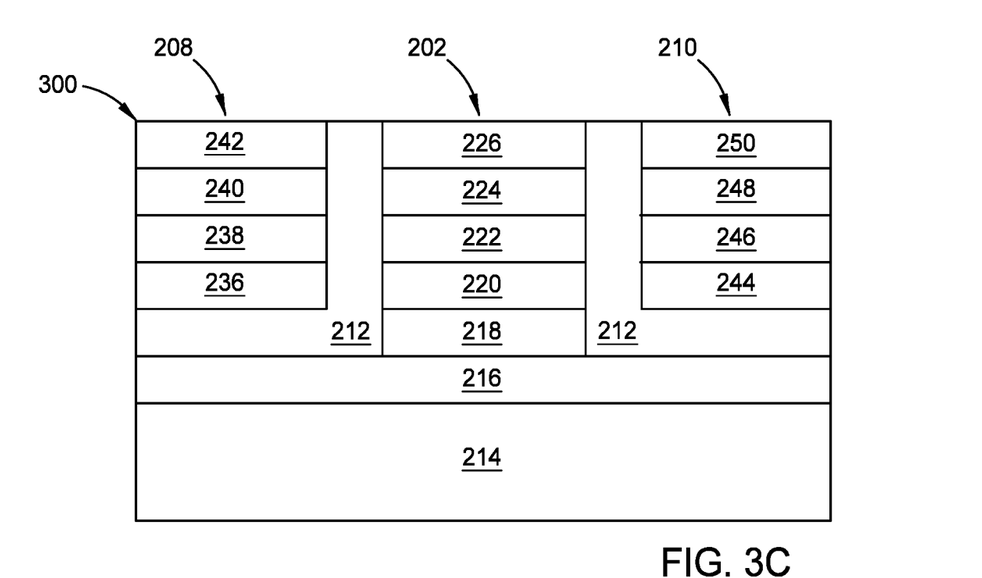

FIGS. 3A-3C are schematic illustrations of a DFL TMR resistor unit 300 that has a hard bias structure on only one side of the DFL. FIG. 3A is a top view of the sensor unit 300 while FIG. 3B is a cross section taken along line C-C and FIG. 3C is a cross section taken along line D-D. The sensor unit 300 includes a DLF TMR 202, a first hard bias structure 204, a first soft bias structure 208, a second soft bias structure 210, and insulating material 212. The second hard bias structure 206 is not present in DFL TMR resistor unit 300, but is otherwise identical to DFL TMR resistor unit 200.

Figure 4A:
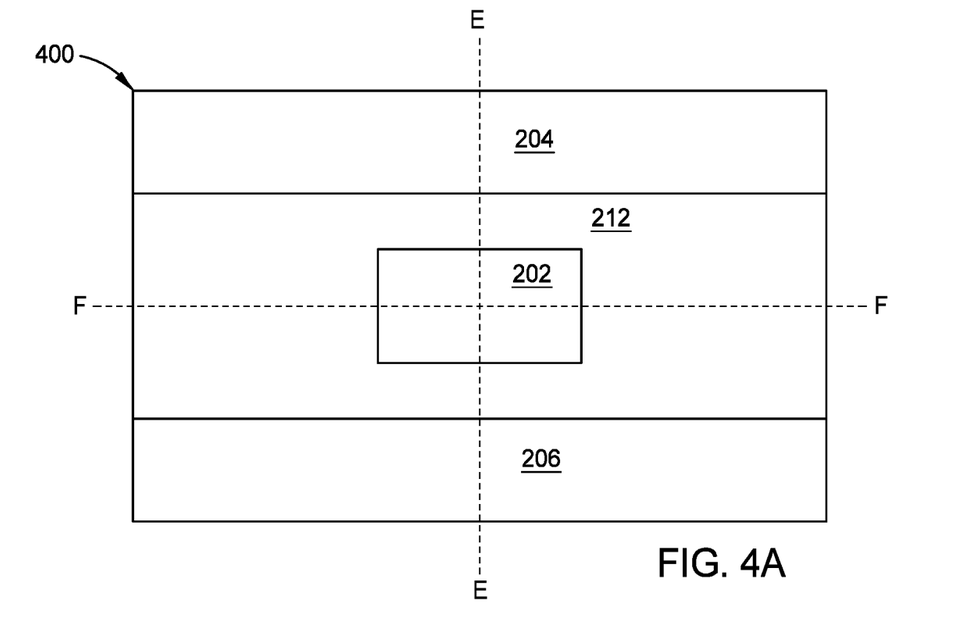
FIGS. 4A-4C are schematic illustrations of a DFL TMR resistor unit that has hard bias structures on both sides of the DFL.
Figure 4B:
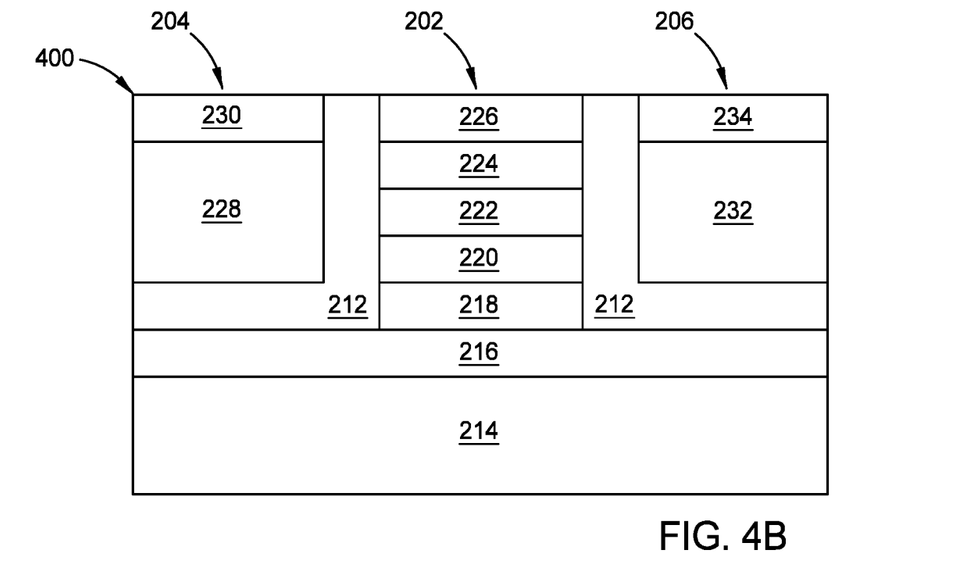
Figure 4C:
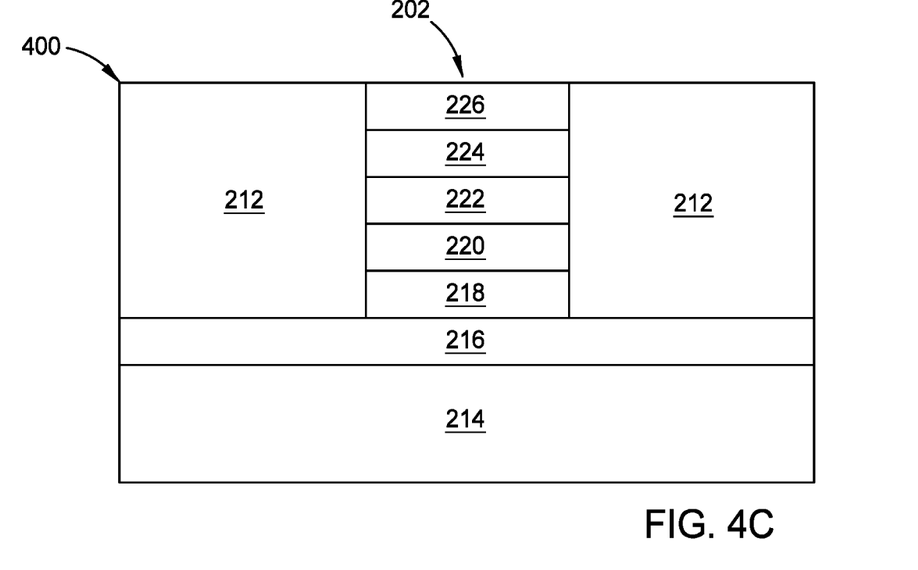

FIGS. 4A-4C are schematic illustrations of a DFL TMR resistor unit 400 that has hard bias structures on both sides of the DFL. FIG. 4A is a top view of the sensor unit 400 while FIG. 4B is a cross section taken along line E-E and FIG. 4C is a cross section taken along line F-F. The sensor unit 400 includes a DLF TMR 202, a first hard bias structure 204, a second hard bias structure 206, and insulating material 212. No soft bias structures 208, 210 are present in DFL TMR resistor unit 400, but the resistor unit 400 is otherwise identical to DFL TMR resistor unit 200.

Figure 5A:
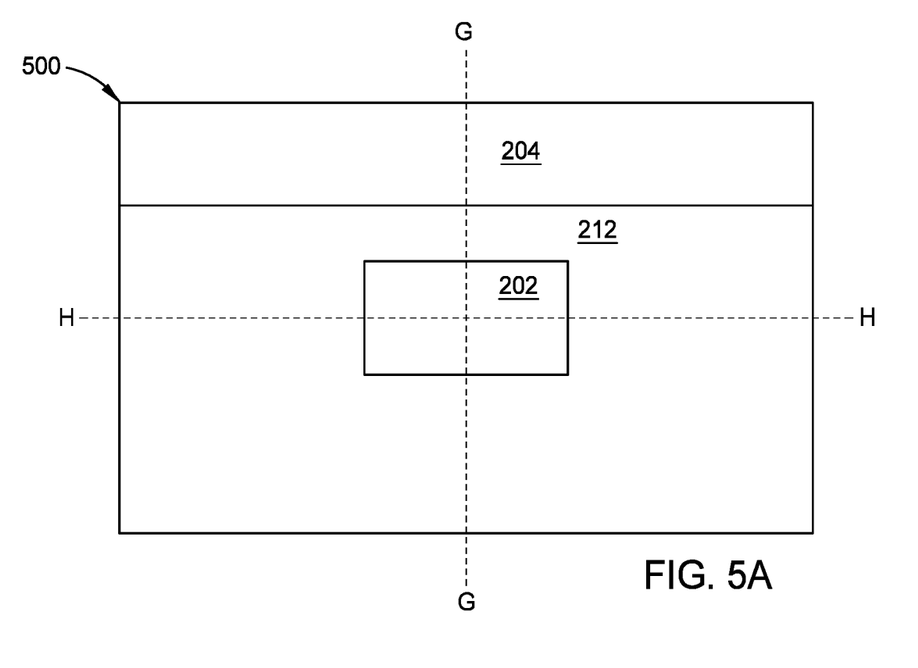
FIGS. 5A-5C are schematic illustrations of a DFL TMR resistor unit that has a hard bias structure on only one side of the DFL.
Figure 5B:
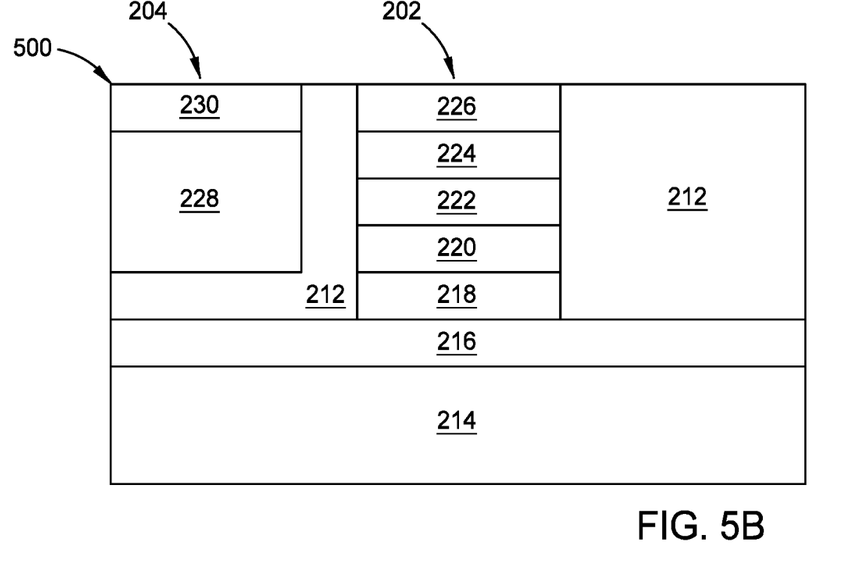
Figure 5C:
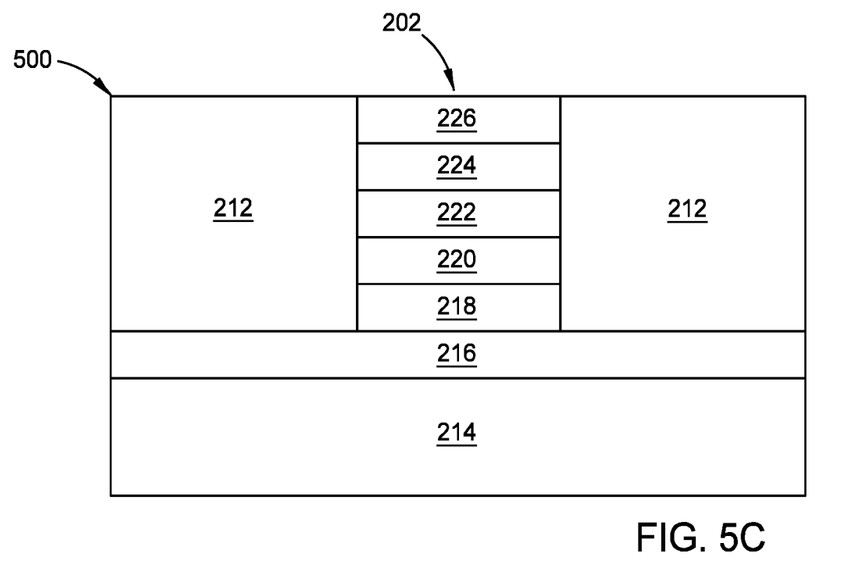

FIGS. 5A-5C are schematic illustrations of a DFL TMR resistor unit 500 that has a hard bias structure on only one side of the DFL. FIG. 5A is a top view of the sensor unit 500 while FIG. 5B is a cross section taken along line G-G and FIG. 5C is a cross section taken along line H-H. The sensor unit 500 includes a DLF TMR 202, a first hard bias structure 204, and insulating material 212. No soft bias structures 208, 210 or second hard bias structures 206 are present in DFL TMR resistor unit 500, but the resistor unit 500 is otherwise identical to DFL TMR resistor unit 200.

Figure 6A:
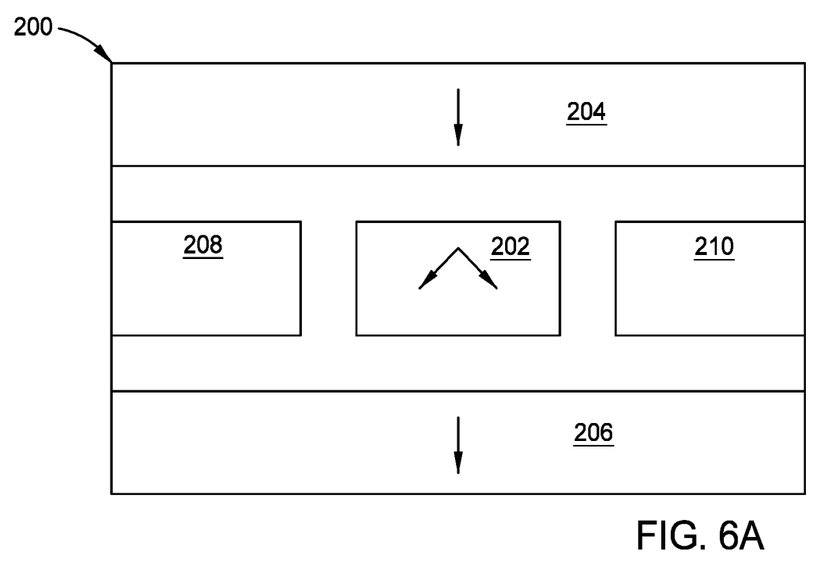
FIGS. 6A-6F are schematic illustrations of a DFL TMR magnetic response to external fields according to embodiments discussed herein.
Figure 6B:
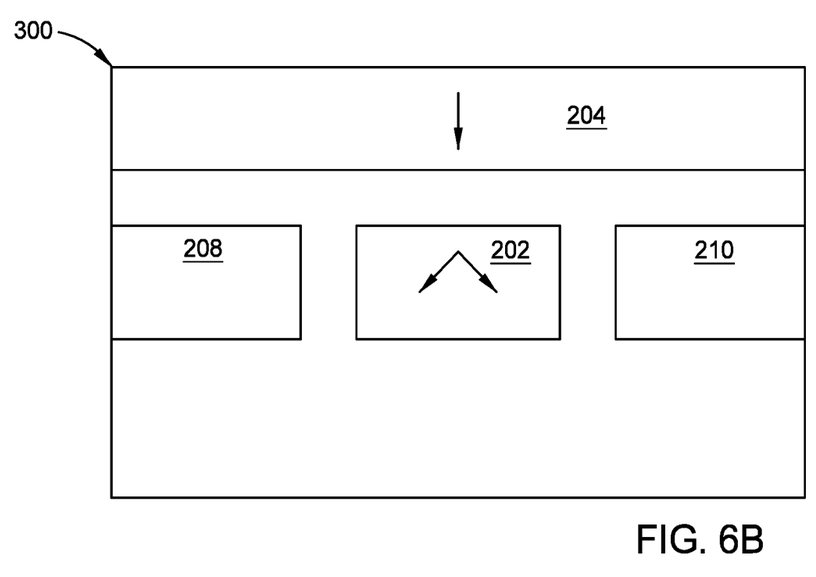
Figure 6C:
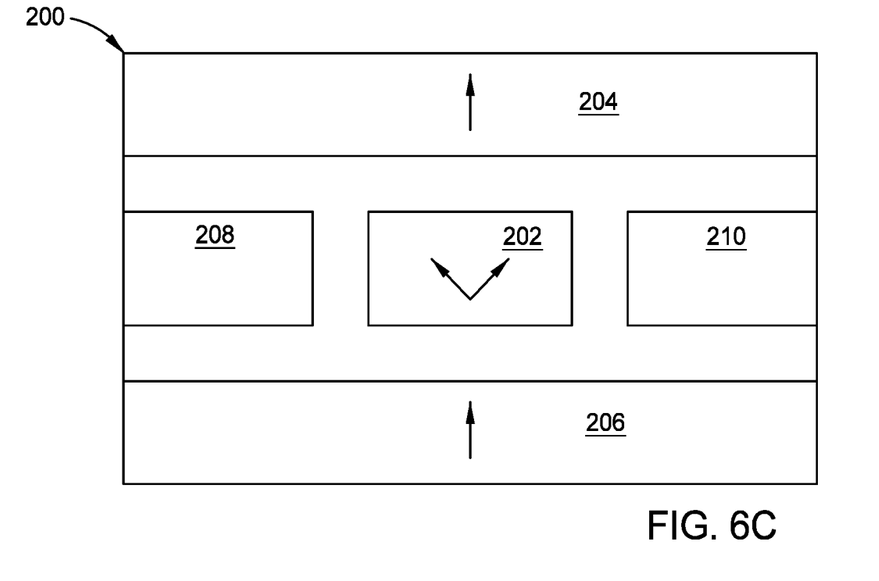
Figure 6D:
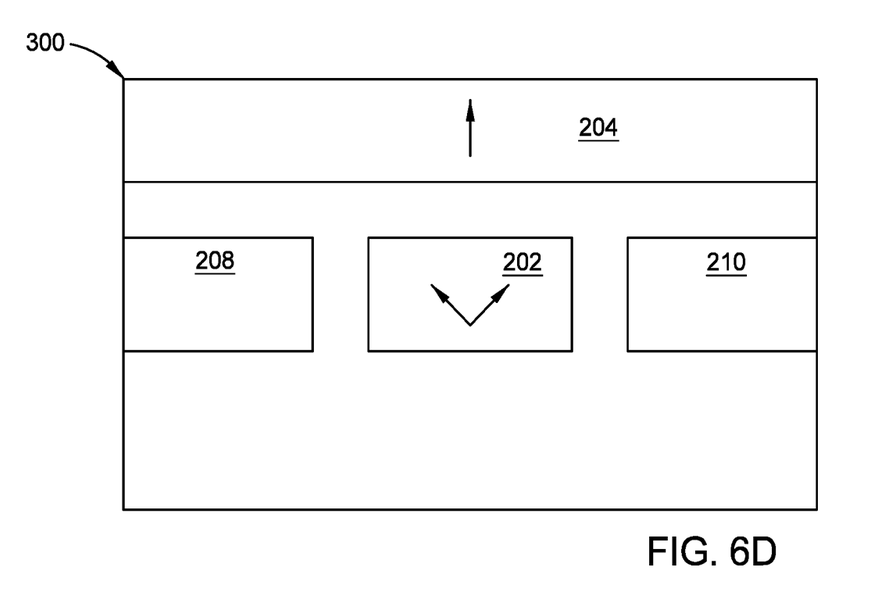
Figure 6E:
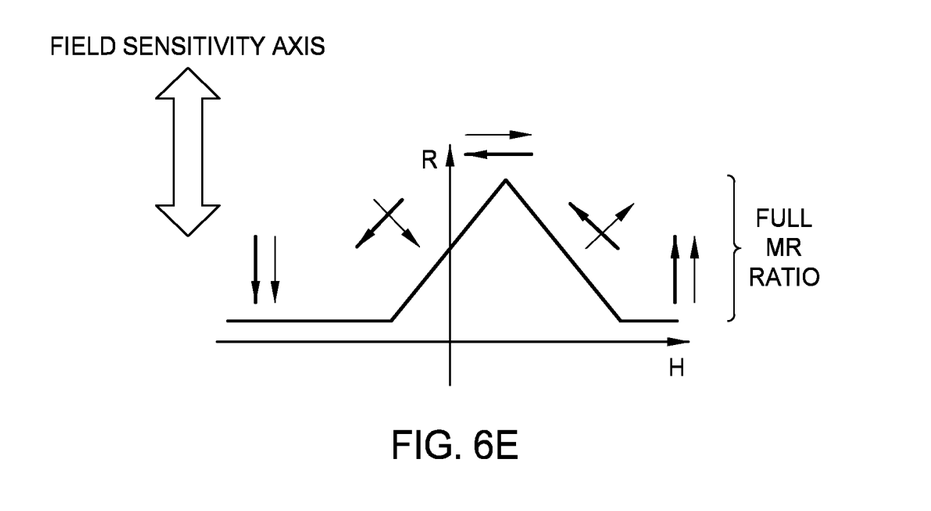
Figure 6F:
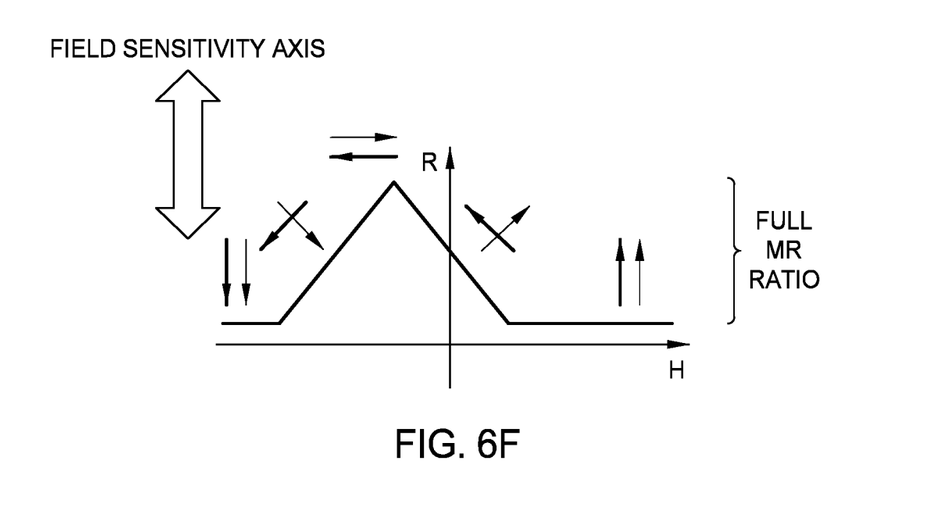

For resistor units that include the soft bias structure 208, 210, the soft bias structures 208, 210 are synthetic antiferromagnetic film stacks. The free layers 220, 224 have magnetic moments that tend to be antiparallel to each other due to the coupling from the soft bias structures 208, 210. However, the hard bias stray fields tilt the magnetic moments of the free layer 220, 224 and turns out the magnetic moments to form a scissor state as shown in FIGS. 6A-6D. The scissor angle (i.e., the angle between the first free layer 220 magnetization and the second free layer 224 magnetization) can be adjusted by changing the hard bias 204, 206 magnetic moment. The hard bias can be optimized to make the scissor ~90 degrees at the initial state. When applying all external fields, the angle will vary from 90 degrees to 0 degrees or 90 degrees to 180 degrees. The varying angle allows the sensors 200, 300, 400, 500 to be operated in a full magnetoresistive range as shown in FIGS. 6E-6F. FIGS. 6E-6F are schematic illustrations of a DFL TMR magnetic response to external fields according to embodiments discussed herein. The scissor pointing direction is determined by the hard bias magnetization directions. The scissor pointing direction is shown as the arrows in DFL TMR 202.

Figure 7A:
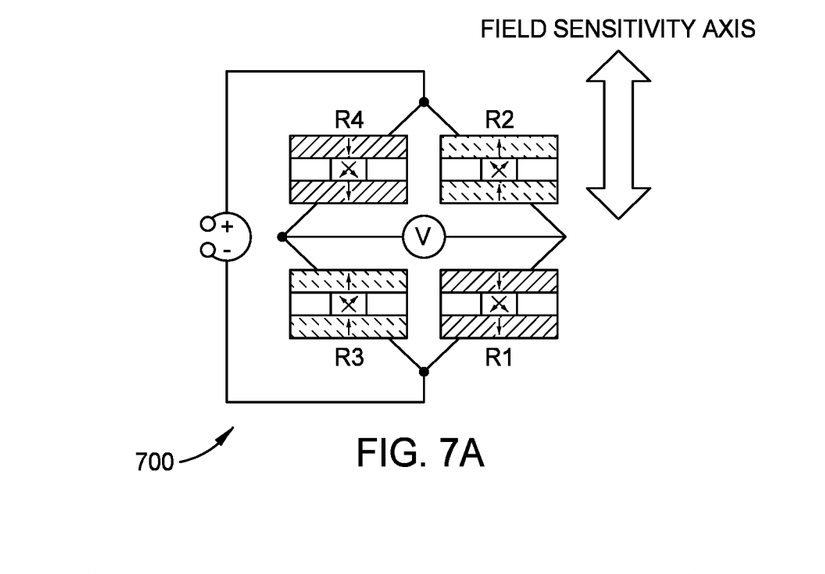
FIGS. 7A-7C are schematic illustrations of a Wheatstone bridge with a DFL TMR films according to embodiments discussed herein.
Figure 7B:
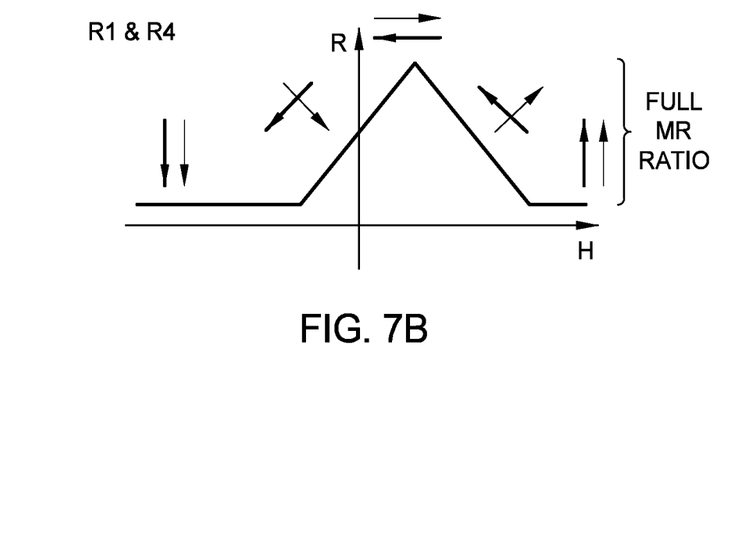
Figure 7C:
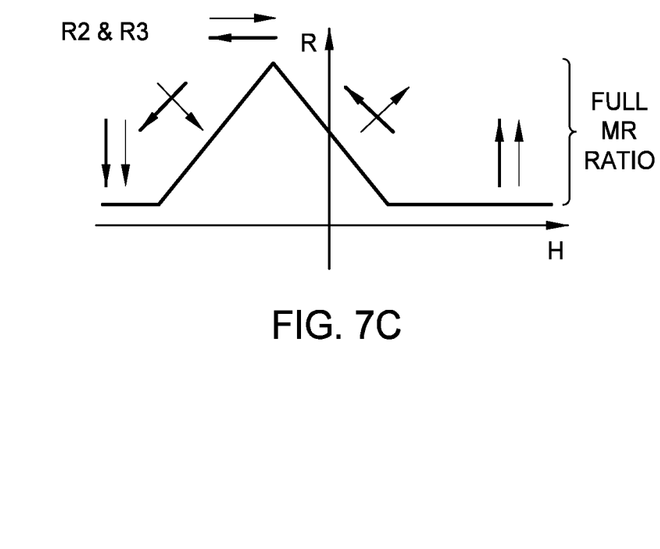

As discussed herein, resistors in a Wheatstone bridge that use two different hard bias materials with different coercivities are used to create hard bias magnetization directions that are opposite each other. FIGS. 7A-7C are schematic illustrations of a Wheatstone bridge 700 with DFL TMR resistors according to embodiments discussed herein. In the bridge 700, resistors R1 and R4 are identical to each other. Similarly, resistors R2 and R3 are identical to each other. However, while resistors R1 and R4 are identical to each other, resistors R1 and R4 are different from resistors R2 and R3. There are several ways in which the resistors R1-R4 can be arranged to achieve the required criteria.

In one embodiment, resistors R1-R4 all comprise one or more resistor units 200. The resistor units 200 are identical for resistors R1 and R4. The resistor units 200 are identical for resistors R2 and R3. However, the resistor units 200 for R1 and R4 are different from the resistor units for resistors R2 and R3. Specifically, the hard bias material 228, 232 is different. More specifically, the hard bias material 228, 232 is identical for resistors R1 and R4, the hard bias material 228, 232 is identical for resistors R2 and R3, but the hard bias material 228, 232 for resistors R1 and R4 is different than the hard bias material 228, 232 for resistors R3 and R4. Due to the different hard bias materials 228, 232, the hard bias magnetization directions for resistors R1 and R4 can be set to be different than the hard bias magnetization directions for resistors R2 and R3.

In another embodiment, resistors R1-R4 all comprise one or more resistor units 300. The sensor units 300 are identical for resistors R1 and R4. The sensor units 300 are identical for resistors R2 and R3. However, the sensor units 300 for R1 and R4 are different from the sensor units for resistors R2 and R3. Specifically, the hard bias material 228 is different. More specifically, the hard bias material 228 is identical for resistors R1 and R4, the hard bias material 228 is identical for resistors R2 and R3, but the hard bias material 228 for resistors R1 and R4 is different than the hard bias material 228 for resistors R3 and R4. Due to the different hard bias materials 228, the hard bias magnetization directions for resistors R1 and R4 can be set to be different than the hard bias magnetization directions for resistors R2 and R3.

In another embodiment, resistors R1-R4 all comprise one or more resistor units 400. The resistor units 400 are identical for resistors R1 and R4. The resistor units 400 are identical for resistors R2 and R3. However, the resistor units 400 for R1 and R4 are different from the resistor units for resistors R2 and R3. Specifically, the hard bias material 228, 232 is different. More specifically, the hard bias material 228, 232 is identical for resistors R1 and R4, the hard bias material 228, 232 is identical for resistors R2 and R3, but the hard bias material 228, 232 for resistors R1 and R4 is different than the hard bias material 228, 232 for resistors R3 and R4. Due to the different hard bias materials 228, 232, the hard bias magnetization directions for resistors R1 and R4 can be set to be different than the hard bias magnetization directions for resistors R2 and R3.

In another embodiment, resistors R1-R4 all comprise one or more resistor units 500. The resistor units 500 are identical for resistors R1 and R4. The resistor units 500 are identical for resistors R2 and R3. However, the resistor units 500 for R1 and R4 are different from the resistor units for resistors R2 and R3. Specifically, the hard bias material 228 is different. More specifically, the hard bias material 228 is identical for resistors R1 and R4, the hard bias material 228 is identical for resistors R2 and R3, but the hard bias material 228 for resistors R1 and R4 is different than the hard bias material 228 for resistors R3 and R4. Due to the different hard bias materials 228, the hard bias magnetization directions for resistors R1 and R4 can be set to be different than the hard bias magnetization directions for resistors R2 and R3.

In other embodiments, resistors R1 and R4 are identical to each other and comprise one or resistor units 200, 300, 400, 500; resistors R2 and R3 are identical to each other and comprise one or more resistor units 200, 300, 400, 500; the resistor units 200, 300, 400, 500 are different for resistors R1 and R4 relative to resistors R2 and R3. For example, if resistors R1 and R4 comprise resistor units 200, then resistors R2 and R3 will comprise either resistor units 300, 400, or 500. Similarly, if resistors R1 and R4 comprise resistor units 300, then resistors R2 and R3 will comprise either resistor units 200, 400, or 500. Additionally, resistors R1 and R4 comprise resistor units 400, then resistors R2 and R3 will comprise either resistor units 200, 300, or 500. Finally, resistors R1 and R4 comprise resistor units 500, then resistors R2 and R3 will comprise either resistor units 200, 300, or 400.

Figure 8:
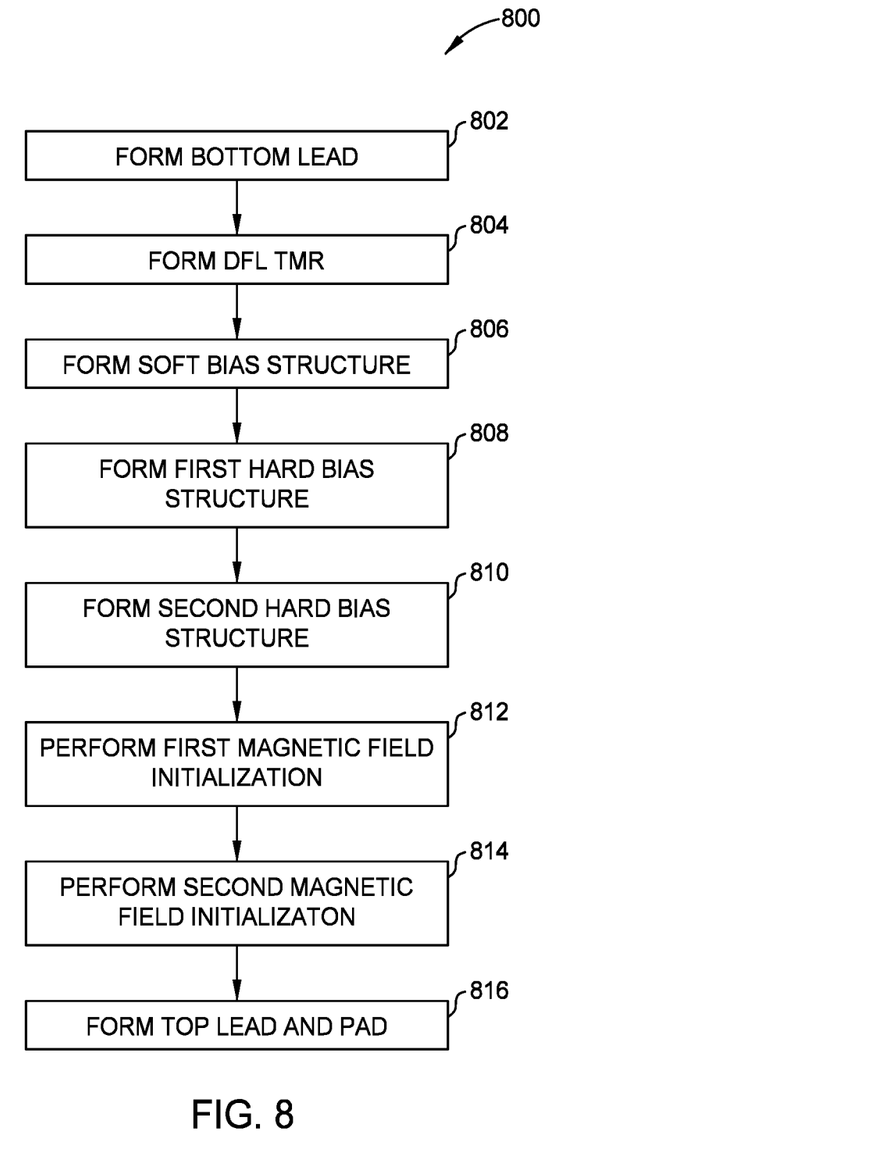
FIG. 8 is a flow chart illustrating a method of manufacturing a Wheatstone bridge according to one embodiment.

FIG. 8 is a flow chart illustrating a method 800 of manufacturing a Wheatstone bridge according to one embodiment. The process begins by first forming the bottom lead in step 802. Thereafter, the DFL TMR structure is formed in step 804. In step 806, the soft bias structure is formed. Step 806 is a standard process in reader fabrication that involves photo printing, magnetic tunnel junction milling, atomic layer deposition (ALD) insulator deposition, refilling soft bias materials, sidewall milling to open photoresist, photo lift-off, and chemical mechanical polishing (CMP). In steps 808 and 810, the hard bias structures are formed. The hard bias structure formation is similar to step 806, but rather than refilling with soft bias materials, magnetically hard materials are used. More specifically, photo printing, ALD insulator deposition, refilling magnetically hard materials, sidewall milling to open photoresist, photo lift-off, and CMP. Since the hard bias materials and coercivities are to be different for resistors R1 and R4 relative to resistors R2 and R3, the magnetization directions for the hard bias materials for resistors R1-R4 are initially set in the same direction in step 812 by applying a first magnetic field that is greater than the coercivity of the hard bias materials for resistors R1-R4. Thereafter, a second magnetic field is applied that is less than the first magnetic field in step 814. The second magnetic field is less than the magnetic coercivity of the hard bias material for resistors R1 and R4 (or resistors R2 and R3), but greater than the magnetic coercivity of the hard bias material for resistors R2 and R3 (or resistors R1 and R4). The second field is applied in the opposite direction of the first magnetic field. The second field will cause not impact the magnetization direction of resistors R1 and R4 (or resistors R2 and R3), but will reverse the magnetization direction of resistors R2 and R3 (or resistors R1 and R4). Thereafter, the top lead and pad are formed in step 816. Thus, a Wheatstone bridge is formed in which resistors R1 and R4 are identical, resistors R2 and R3 are identical yet different than resistors R1 and R4, and the magnetization direction of resistors R1 and R4 are opposite the magnetization direction of resistors R2 and R3.

In one embodiment, a TMR sensor device comprises: a first resistor including a dual free layer (DFL) tunnel magnetoresistive (TMR) structure having at least one first hard bias structure of a first hard bias material; and a second resistor including a DFL TMR structure having at least one second hard bias structure of a second hard bias material that is different from the first hard bias material. The at least one first hard bias structure for the first resistor comprises two first hard bias structures. The at least one second hard bias structure for the second resistor comprises two second hard bias structures. The DFL TMR structure of the first resistor includes one or more first soft bias structures. The DFL TMR structure of the second resistor includes one or more second soft bias structures. The one or more first soft bias structures includes two first soft bias structures. The one or more second soft bias structures includes two second soft bias structures. The first hard bias material and the second hard bias material comprise the same compound with different element ratios. The first hard bias material and the second hard bias material comprise different compounds. The DFL TMR structure includes a seed layer, a first free layer, a barrier layer, a second free layer, and a capping layer.

In another embodiment, a TMR sensor device comprises: a plurality of resistors that each comprise a DFL TMR structure, one or more hard bias structures adjacent the DFL TMR structure, and one or more soft bias structures adjacent the DFL TMR structure and the one or more hard bias structures, wherein the one or more hard bias structures are different in at least two resistors of the plurality of resistors. The one or more soft bias structures includes a first soft bias layer, a spacer layer, a second soft bias layer, and a capping layer. The TMR sensor arrangement further comprises an insulating layer disposed between the one or more soft bias structures and the DFL TMR. The TMR sensor arrangement further comprises an insulating layer disposed between the one or more hard bias structures and the DFL TMR. The insulating layer is disposed between the one or more hard bias structures and the one or more soft bias structures. The insulating layer is disposed between the one or more soft bias structures and the DFL TMR. The DFL TMR is disposed on a bottom lead. The one or more soft bias structures and the one or more hard bias structures are spaced from the bottom lead by a dielectric material.

In another embodiment, a method of making a TMR sensor device comprises: forming a bottom lead over a substrate; forming a DFL TMR structure over the bottom lead for a first resistor and a second resistor; forming at least one hard bias structure adjacent the DFL TMR structure for the first resistor; forming at least one hard bias structures adjacent the DFL TMR structure for the second resistor; applying a first magnetic field initialization to the first resistor and the second resistor; and applying a second magnetic field initialization to the first resistor and the second resistor, wherein the second magnetic field is different from the first magnetic field. The second magnetic field is less than the first magnetic field.

In one embodiment, the TMR sensor is used in a camera operating as a single axis sensor. An example of such a sensor is found in United States Patent Application Publication No.: 2019/0020822 A1, which is incorporated herein by reference. However, it is contemplated that the TMR sensor may be utilized as a two dimensional or even a three dimensional sensor. Additionally, it is contemplated that TMR sensor may be integrated and utilized in inertial measurement unit technologies other than cameras such as wearable devices, compasses, and MEMS devices. Furthermore, the TMR sensor may operate as a position sensor, a bridge angular sensor, a magnetic switch, a current sensor, or combinations thereof. The TMR sensor may be used to focus a camera such as a smart phone camera by using the TMR sensors as position and angular sensors. Also, TMR sensors have applicability in the automotive industry as switch, current, and angular sensors to replace current Hall, anisotropic magnetoresistance (AMR) and giant magnetoresistance (GMR) sensors. TMR sensors may also be used in the drones and robotics industry as position and angular sensors. Medical devices can also utilize TMR sensors for flow rate control for infusion systems and endoscope camera sensors among others. Thus, the TMR sensors discussed herein have applications well beyond smart phone cameras and thus should not be limited to use as sensors for smart phone cameras. Furthermore, TMR sensors need not be arranged in a Wheatstone bridge arrangement, but rather, may be arranged in any number of manners.

By using hard bias structures in a DFL TMR structure, the magnetoresistance for resistors in a Wheatstone bridge can be made to change differently.

While the foregoing is directed to embodiments of the present disclosure, other and further embodiments of the disclosure may be devised without departing from the basic scope thereof, and the scope thereof is determined by the claims that follow.

What is claimed is:

1. A tunnel magnetoresistive (TMR) sensor device, comprising:
   a first resistor including a dual free layer (DFL) TMR structure having at least one first hard bias structure of a first hard bias material and at least one insulation layer disposed between the DFL TMR structure and the first hard bias structure; and
   a second resistor including a DFL TMR structure having at least one second hard bias structure of a second hard bias material that is different from the first hard bias material and at least one insulation layer disposed between the DFL TMR structure and the second hard bias structure.

2. The TMR sensor device of claim 1, wherein the at least one first hard bias structure for the first resistor comprises two first hard bias structures.

3. The TMR sensor device of claim 2, wherein the at least one second hard bias structure for the second resistor comprises two second hard bias structures.

4. The TMR sensor device of claim 3, wherein the DFL TMR structure of the first resistor includes one or more first soft bias structures.

5. The TMR sensor device of claim 4, wherein the DFL TMR structure of the second resistor includes one or more second soft bias structures.

6. The TMR sensor device of claim 5, wherein the one or more first soft bias structures includes two first soft bias structures.

7. The TMR sensor device of claim 6, wherein the one or more second soft bias structures includes two second soft bias structures.

8. The TMR sensor device of claim 3, wherein the first hard bias material and the second hard bias material comprise the same compound with different element ratios.

9. The TMR sensor device of claim 3, wherein the first hard bias material and the second hard bias material comprise different compounds.

10. The TMR sensor device of claim 1, wherein the DFL TMR structure includes a seed layer, a first free layer, a barrier layer, a second free layer, and a capping layer.

11. A TMR sensor device, comprising:
a plurality of resistors that each comprises a DFL TMR structure, one or more hard bias structures adjacent the DFL TMR structure, and one or more soft bias structures adjacent the DFL TMR structure and the one or more hard bias structures, wherein the one or more hard bias structures are different in at least two resistors of the plurality of resistors; and
an insulating layer disposed between the one or more hard bias structures and the DFL TMR.

12. The TMR sensor device of claim 11, wherein the one or more soft bias structures includes a first soft bias layer, a spacer layer, a second soft bias layer, and a capping layer.

13. The TMR sensor device of claim 12, further comprising a spacer layer disposed between the one or more soft bias structures and the DFL TMR.

14. The TMR sensor device of claim 11, wherein the insulating layer is disposed between the one or more hard bias structures and the one or more soft bias structures.

15. The TMR sensor device of claim 14, wherein the insulating layer is disposed between the one or more soft bias structures and the DFL TMR.

16. The TMR sensor device of claim 11, wherein the DFL TMR is disposed on a bottom lead.

17. A TMR sensor device, comprising:
a plurality of resistors that each comprises a DFL TMR structure, one or more hard bias structures adjacent the DFL TMR structure, and one or more soft bias structures adjacent the DFL TMR structure and the one or more hard bias structures, wherein the one or more hard bias structures are different in at least two resistors of the plurality of resistors, wherein the DFL TMR is disposed on a bottom lead, and wherein the one or more soft bias structures and the one or more hard bias structures are spaced from the bottom lead by a dielectric material.

18. A method of making a TMR sensor device, comprising:
forming a bottom lead over a substrate;
forming a DFL TMR structure over the bottom lead for a first resistor and a second resistor;
forming at least one hard bias structure adjacent the DFL TMR structure for the first resistor;
forming at least one hard bias structure adjacent the DFL TMR structure for the second resistor;
applying a first magnetic field initialization to the first resistor and the second resistor; and
applying a second magnetic field initialization to the first resistor and the second resistor, wherein the second magnetic field is different from the first magnetic field.

19. The method of claim 18, wherein the second magnetic field is less than the first magnetic field.

20. The TMR sensor device of claim 11, wherein the DFL TMR structure includes a seed layer, a first free layer, a barrier layer, a second free layer, and a capping layer.

* * * * *